United States Patent
Liao

(10) Patent No.: US 10,116,076 B2
(45) Date of Patent: Oct. 30, 2018

(54) CPU RETAINER MOUNTED UPON PCB

(71) Applicant: FOXCONN INTERCONNECT TECHNOLOGY LIMITED, Grand Cayman (KY)

(72) Inventor: Fang-Jwu Liao, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/829,784

(22) Filed: Dec. 1, 2017

(65) Prior Publication Data
US 2018/0159253 A1    Jun. 7, 2018

(30) Foreign Application Priority Data
Dec. 1, 2016   (CN) .................... 2016 2 1311053 U

(51) Int. Cl.
*H01R 12/88*  (2011.01)
*H01R 12/70*  (2011.01)
*H05K 7/10*   (2006.01)

(52) U.S. Cl.
CPC ......... *H01R 12/88* (2013.01); *H01R 12/7076* (2013.01); *H05K 7/1007* (2013.01)

(58) Field of Classification Search
CPC .... H05K 7/1023; H05K 3/325; H05K 7/1053; H01R 23/684
USPC .................................................... 439/73, 331
See application file for complete search history.

(56) References Cited

U.S. PATENT DOCUMENTS

| | | | | |
|---|---|---|---|---|
| 7,708,571 | B2* | 5/2010 | Terhune | H05K 7/1053 439/135 |
| 7,896,679 | B2* | 3/2011 | Hsu | H01R 12/88 439/331 |
| 8,137,121 | B2* | 3/2012 | Dai | H05K 7/1053 439/135 |
| 9,192,070 | B2* | 11/2015 | Tan | H05K 7/10 |
| 9,960,513 | B1* | 5/2018 | Peng | H01R 12/88 |
| 2009/0191745 | A1* | 7/2009 | Liao | H01R 12/7011 439/331 |

FOREIGN PATENT DOCUMENTS

CN          205104653 U    3/2016

* cited by examiner

*Primary Examiner* — Gary Paumen
(74) *Attorney, Agent, or Firm* — Wei Te Chung; Ming Chieh Chang

(57) ABSTRACT

An electrical connector assembly includes an electrical connector with an insulative housing retaining a plurality of conductive contacts therein, and a clip positioned by one end of the housing and adapted to be mounted upon a loading cavity in the housing. The clip includes a mounting section for mounting to the PCB, and a holding section forming a holding cavity for holding the CPU wherein the holding section is rotatable relative to the mounting section and adapted to be downwardly pressed by the load plate which is pivotally mounted by the other end of the housing opposite to the clip.

19 Claims, 7 Drawing Sheets

CPU RETAINER MOUNTED UPON PCB

1. FIELD OF THE DISCLOSURE

The invention is related to an electrical connector mounted upon a printed circuit board, and particularly to a socket associated with a deflectable retainer for holding the CPU (Central Processing Unit) for stably loading the CPU into the socket.

2. DESCRIPTION OF RELATED ARTS

Chinese patent application publication CN205104653 discloses the electrical connector for receiving a CPU. Anyhow, the user essentially uses the fingers to hold the CPU during loading, thus tending to damaging the contacts if an unbalanced situation occurs.

It is desired to provide an electrical connector with a reliable device to stably hold the CPU during loading the CPU into the socket.

SUMMARY OF THE DISCLOSURE

To achieve the above desire, an electrical connector assembly for connecting a CPU to a printed circuit board (PCB). The electrical connector assembly includes an electrical connector with an insulative housing retaining a plurality of conductive contacts therein, and a clip positioned by one end of the housing and adapted to be mounted upon a loading cavity in the housing. The clip includes a mounting section for mounting to the PCB, and a holding section for holding the CPU wherein the holding section is rotatable relative to the mounting section and adapted to be downwardly pressed by the load plate which is pivotally mounted by the other end of the housing.

The connector is further equipped with a load plate downwardly pressing the at least one of the clip or the CPU for establishing reliable connection between the CPU and the conductive contacts.

DETAILED DESCRIPTION OF THE PREFERRED EMBODIMENT

Figure 1:
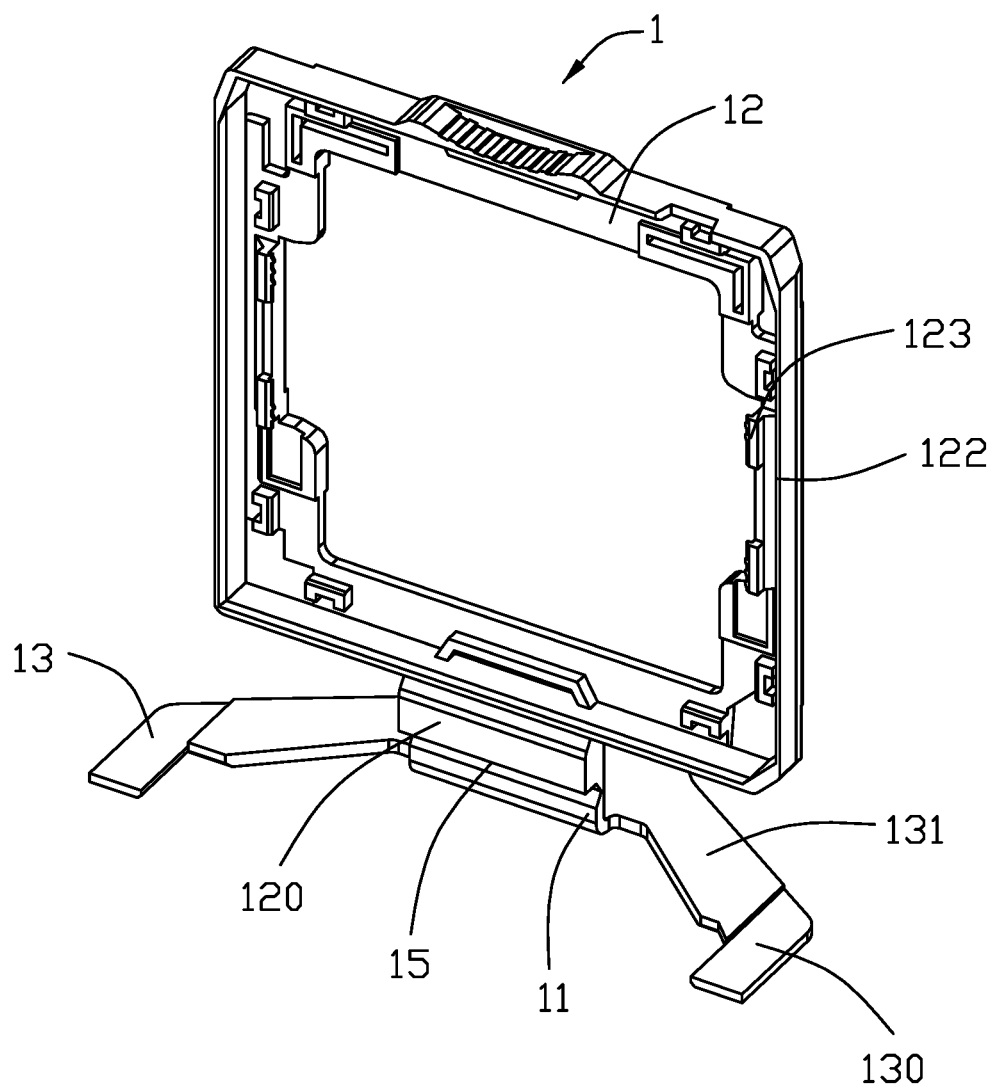
FIG. 1 is a front perspective view of a clip of an electrical connector assembly in an open/upstanding position according to the invention.
Figure 2:
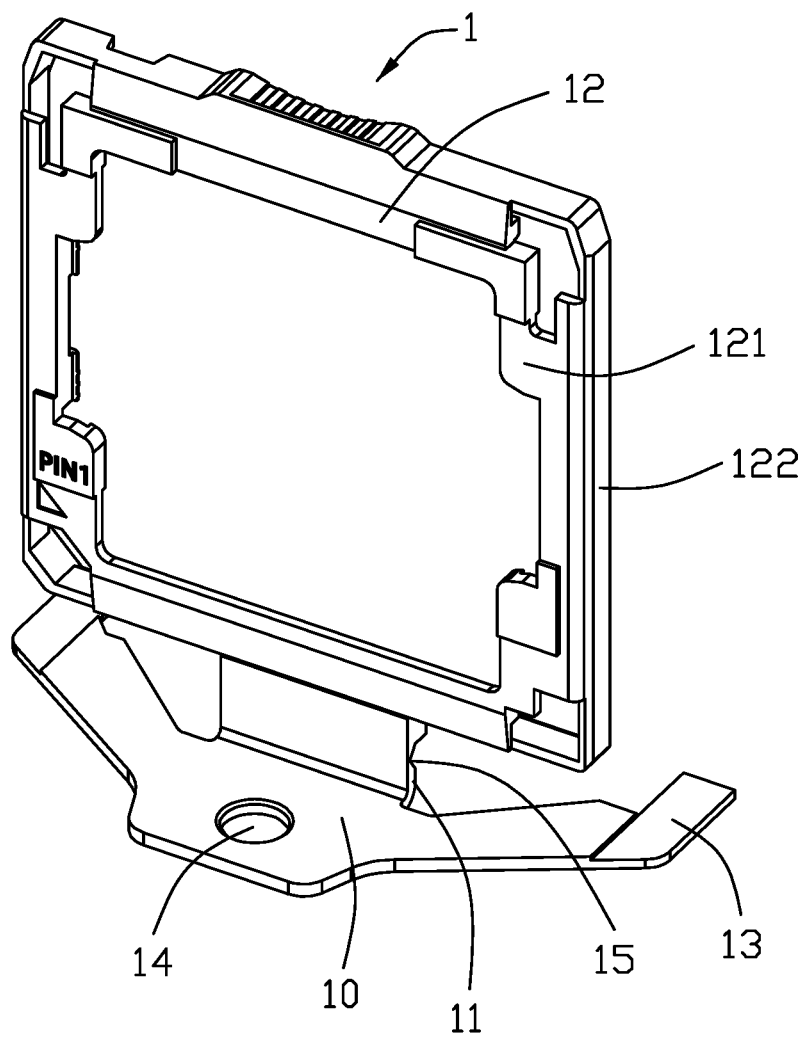
FIG. 2 is a rear perspective view of the clip the electrical connector assembly of FIG. 1.
Figure 3:
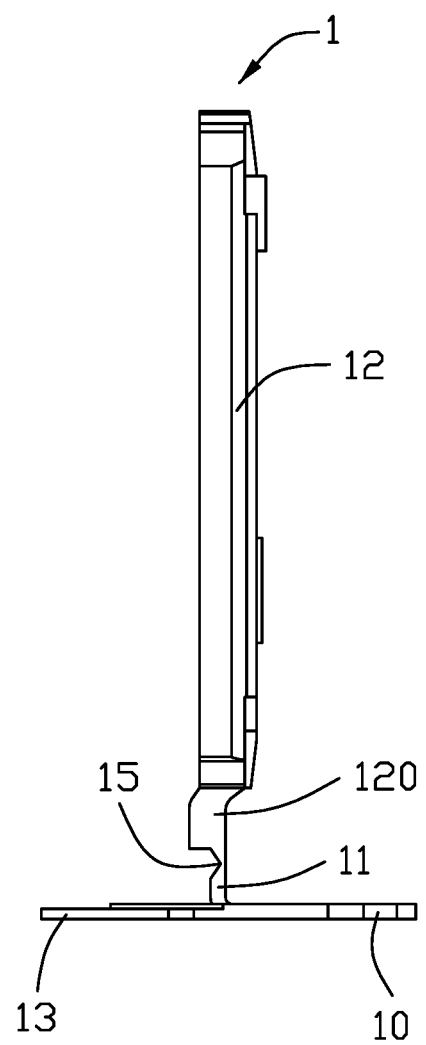
FIG. 3 is a side view of the clip the electrical connector assembly of FIG. 1.
Figure 4:
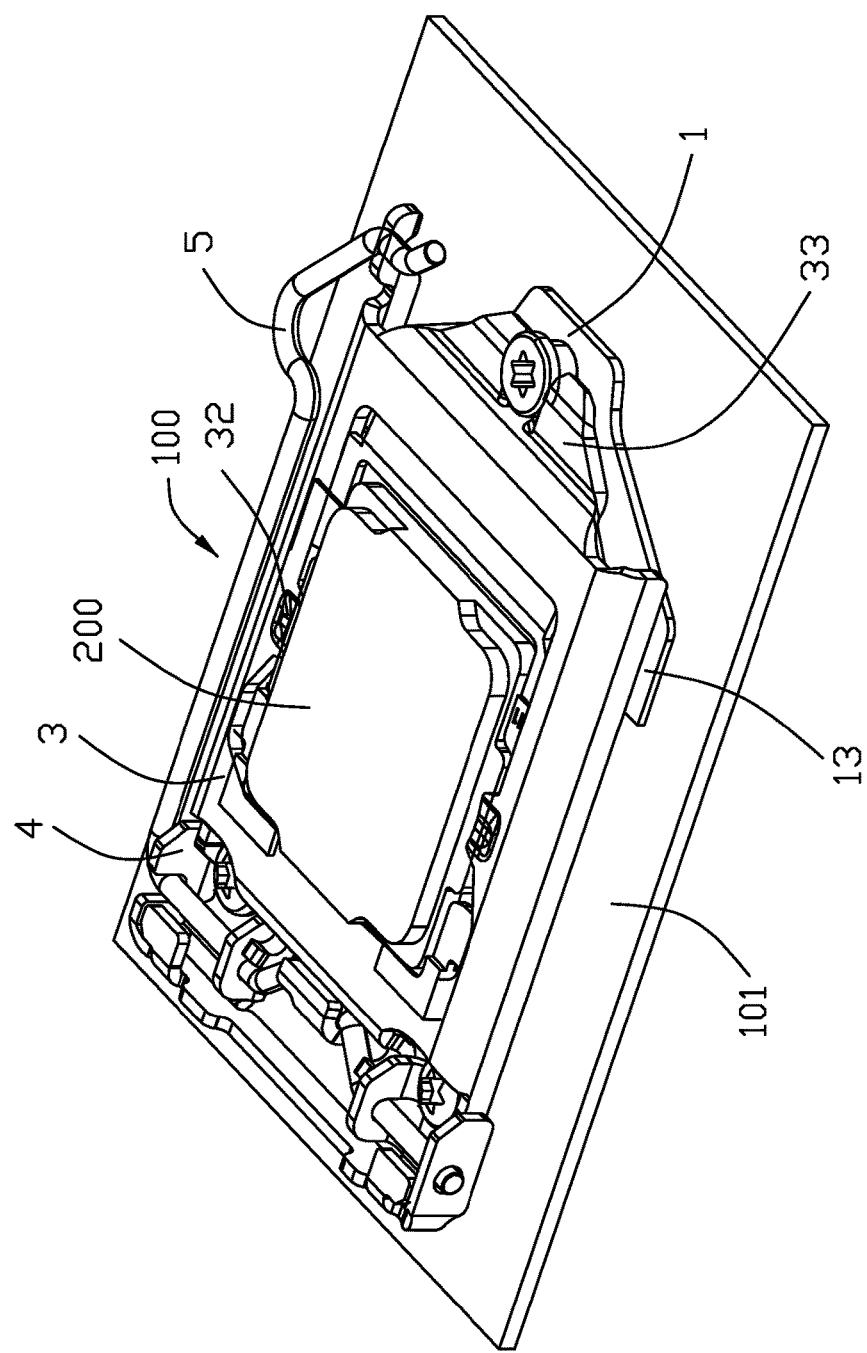
FIG. 4 is a perspective view of the electrical connector assembly mounted upon a printed circuit board, including the clip shown in FIG. 1 wherein the load plate and the clip are both in a closed state.
Figure 5:
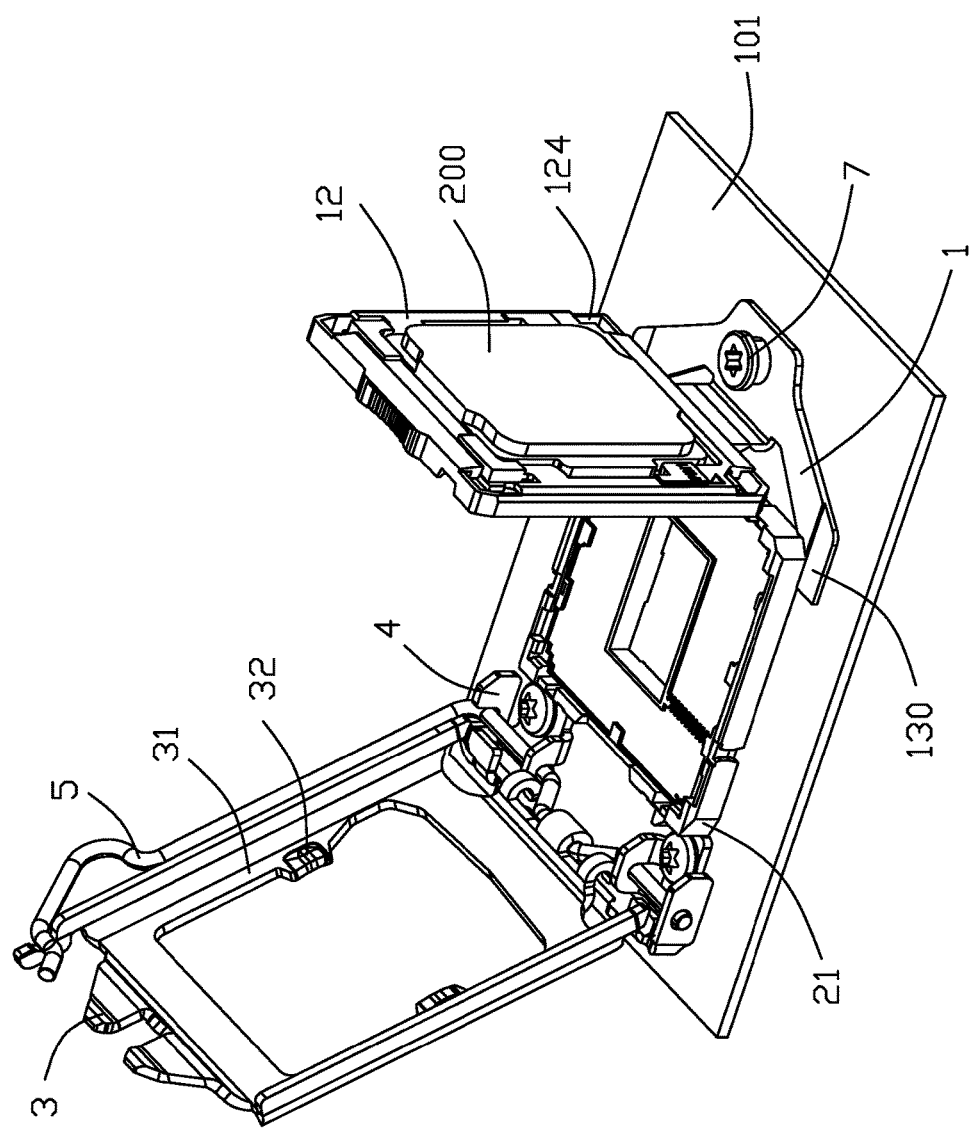
FIG. 5 is a perspective view of the electrical connector assembly of FIG. 4 wherein the load plate and the clip are both in an open state.
Figure 6:
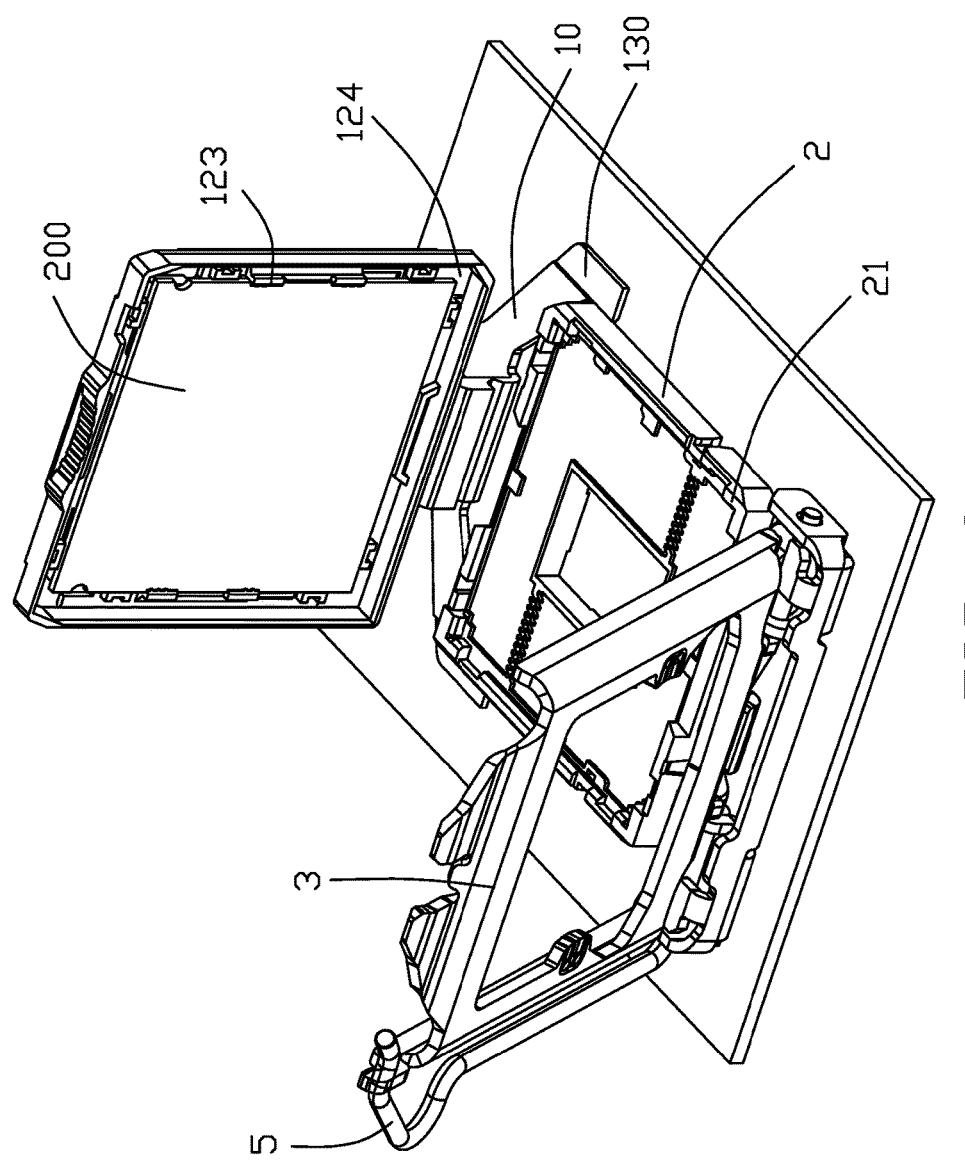
FIG. 6 is another perspective view of the electrical connector assembly of FIG. 5 wherein the load plate and the clip are both in the open state.
Figure 7:
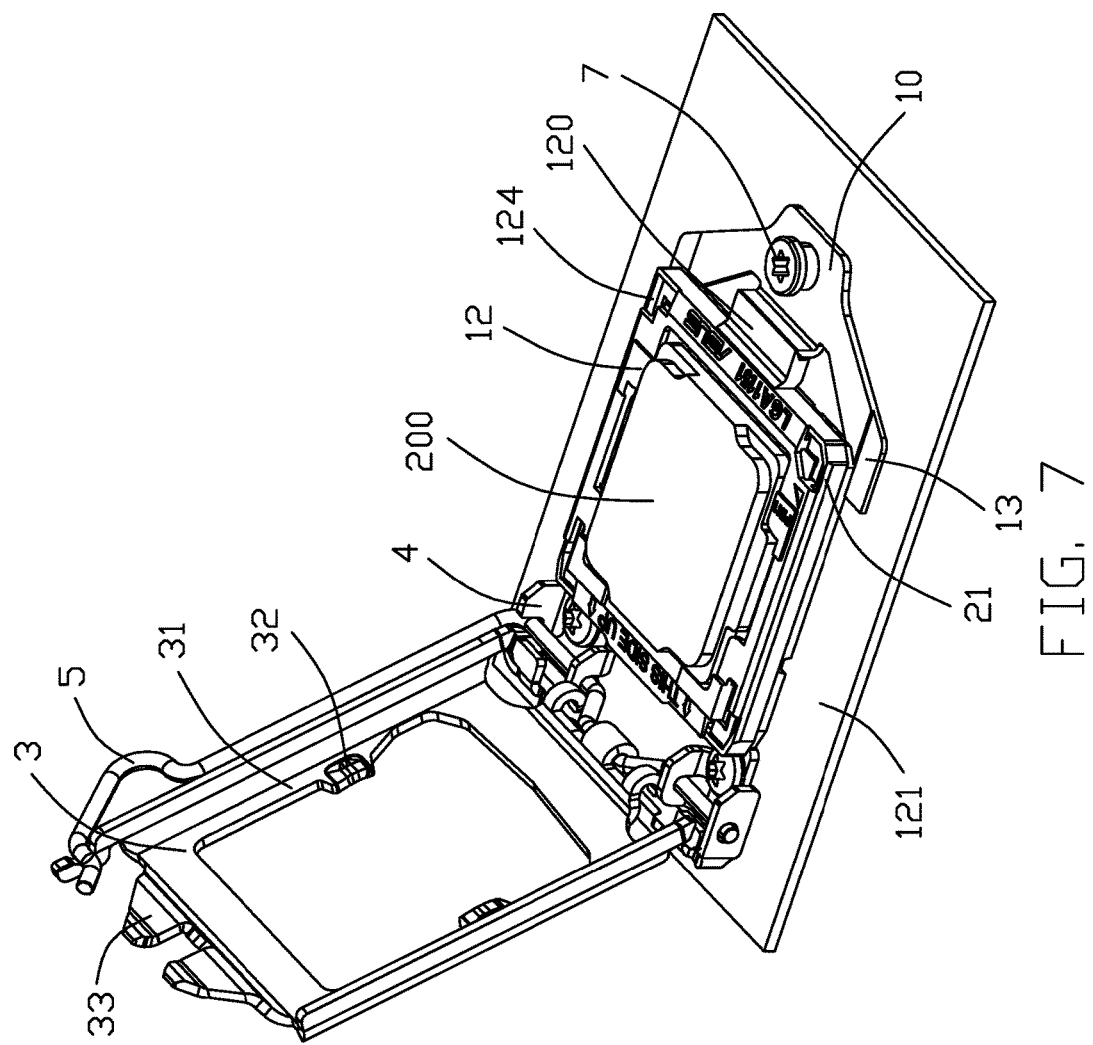
FIG. 7 is a perspective view of the electrical connector assembly of FIG. 6 wherein the clip with the associated CPU is loaded into the loading cavity of the housing while the load plate is still in an open position.

Reference will now be made in detail to the embodiments of the present disclosure. Referring to FIGS. 1-7, a clip 1 for holding the CPU is mounted upon the PCB 101 and located around the electrical card connector. The clip 1 includes a mounting section 10, a holding section 12 and a linking section 11 therebetween. The holding section 12 includes a main body 121 and an extension 120 connecting to the linking section 11. The clip 1 is made from resilient plastic so as to allow the holding section 12 to be rotatable with regard to the mounting section 10.

A V-shaped cutout 15 is formed between the linking section 11 and the extension 120, preferably to be ninety degrees. The holding section 12 includes side walls 122 extending from peripheral sides of the main body 121. The side walls 122 commonly form a holding cavity for retaining the CPU 200 therein. The main body 121 forms a plurality of holding blocks 123 around the corresponding side walls 122 for holding the CPU 200.

A pair of clamping arms 13 extending from the mounting section 10 to sandwich the housing 2 of the electrical connector in a transverse direction. The holding section 12 is located between the pair of clamping arms 13 when the whole clip 1 is deflected in a horizontal state. The clamping arms 13 includes clamping sections 130 and connecting section 131 linked to the mounting section 10. In this embodiment, the thickness of the clamping section 130 is smaller than that of the connecting section 131 which is equal to the thickness of the mounting section 10.

The electrical connector 100 is used for receiving a CPU or electronic package 200. The electrical connector 100 includes an insulative housing 2, a plurality of conductive contacts (not shown) retained in the housing 2, a fixing seat 4 behind the housing 2, a lever 5 pivotally mounted upon the fixing seat 4, and a load plate 3 pivotally mounted upon the lever 5 wherein the housing forms a CPU loading cavity therein. The mounting section 10 and the fixing seat 4 are located by two ends of the housing 2 in the front-to-back direction. The holding section 12 of the clip 1 holds the CPU 200 for loading into the housing 2. At the same time, the side walls 122 encloses the housing 2 circumferentially when fully assembled. The two clamping arms 13 snugly sandwich the housing 2 therebetween in the transverse direction perpendicular to the front-to-back direction. The two clamping arms 13 also abut against the housing 2 in the front-to-back direction so as to have the clip 1 and the housing 2 mutually positioned in a relatively fixed manner.

A plurality of conductive contacts (not shown) are disposed in the housing. The housing 2 forms four positioning blocks 21 around four corners to restrain the CPU 200. Correspondingly, the clip 1 forms four slots 124 around four corners to accommodate the four positioning blocks 21 when the CPU associated with the clip 1 is located into the CPU loading cavity of the housing 2. Notably, the four positioning blocks 21 of the housing 2 are offset from the holding blocks 123 of the holding section 12 for not interfering with each other.

The load plate 3 includes a frame section 31 with a central opening (not labeled) therein, a pair of pressing sections 32 on two side, and a locking head 33 at a free end opposite to the fixed end where the lever 4 is positioned. When the load plate 3 is moved to a horizontal closed position, the frame section 31 downwardly presses the holding section 12, and the pressing sections 32 further downwardly press the CPU 200. Notably, the thinned clamping section 130 may provide more space for downward movement of the load plate 3.

A fastening device or screw 7 is secured to the PCB 200 and extends through the through hole 14 of the clip 1 to retain the clip 4 is position on the PCB 200. The locking head 33 is also locked to the screw 7 when assembled. In this embodiment, the screw 7 is riveted unto the PCB 200. Also, the fixing seat 4 may be a frame structure to surround the housing 2. Under such a situation, the clip 1 may be mounted to the frame structured fixing seat 4 instead.

When using, the CPU 200 is first positioned into the holding cavity in the clip 1, and successively is rotated along with the holding section 12 relative to the mounting section 11 until the holding section 12 is perpendicular to the linking section 11 wherein the CPU 200 enters the CPU loading cavity in the housing 2 and the side walls 122 surround the housing 2. Successively, the load plate 3 is rotated to the horizontal position to press the clip 1 and the CPU 200 with the locking head 33 slightly touching the screw 7. Lastly, the lever 5 is rotated to the horizontal/locking position to have the locking head 33 securely latched to the screw 7 wherein the load plate 3 efficiently downwardly presses the holding section 12 of the clip 1 to push the CPU 200 downwardly in an even manner without a risk of damaging the contact due to either the finger touch or the tilting loading.

While a preferred embodiment in accordance with the present disclosure has been shown and described, equivalent modifications and changes known to persons skilled in the art according to the spirit of the present disclosure are considered within the scope of the present disclosure as described in the appended claims.

What is claimed is:

1. An electrical connector assembly comprising:
a printed circuit board defining a front-to-back direction and a transverse direction perpendicular to each other;
an insulative housing mounding upon the printed circuit board and defining a loading cavity therein;
a plurality of contacts disposed in the housing;
a fixing seat mounted upon the printed circuit board by one end of the housing in said front-to-back direction;
a one piece clip mounted upon the printed circuit board by the other end of the housing in said front-to-back direction; and
a load plate and a lever commonly secured to the fixing seat in a rotatable manner; wherein
said clip includes a holding section forming a holding cavity for holding an electronic package therein, and said holding section is moveable between an upstanding position and a horizontal position; wherein
the electronic package is disposed in the loading cavity when said clip is moved to the horizontal position.

2. The electrical connector assembly as claimed in claim 1, wherein the lever is pivotally assembled to the fixing seat, and the load plate is pivotally assembled to the lever.

3. The electrical connector assembly as claimed in claim 2, wherein said load plate downwardly presses at least one of said electronic package and the holding section in a vertical direction perpendicular to said front-to-back direction.

4. The electrical connector assembly as claimed in claim 3, wherein said clip is unitarily made of plastic, and includes a mounting section mounted upon the printed circuit board and connected to the holding section via a linking section, said holding section being rotatable relative to the mounting section.

5. The electrical connector assembly as claimed in claim 4, wherein said mounting section includes a pair of clamping arms sidewardly sandwiching the housing in a transverse direction perpendicular to both the front-to-back direction and said vertical direction.

6. The electrical connector assembly as claimed in claim 5, wherein said pair of clamping arms abut against the housing in the front-to-back direction.

7. The electrical connector assembly as claimed in claim 1, further including a securing device not only to fasten the clip in position on the printed circuit board but also lock the load plate in position when the lever is moved to a horizontal position.

8. The electrical connector assembly as claimed in claim 1, wherein said housing includes a plurality of positioning blocks for holding the electronic package, and said holding section includes a plurality of holding blocks for holding the electronic package.

9. The electrical connector assembly as claimed in claim 8, wherein aid positioning blocks and said holding blocks are offset from each other for not interfering with each other.

10. An electrical connector assembly comprising:
an insulative housing defining a front-to-back direction and forming a loading cavity therein;
a plurality of contacts disposed in the housing;
a fixing seat located by one end of the housing in said front-to-back direction;
a one piece clip located by the other end of the housing in said front-to-back direction; and
a load plate and a lever commonly secured to the fixing seat in a rotatable manner; wherein
said clip includes a holding section forming a holding cavity for holding an electronic package therein, and said holding section is moveable between an upstanding position and a horizontal position; wherein
the electronic package is disposed in the loading cavity when said clip is moved to the horizontal position.

11. The electrical connector assembly as claimed in claim 10, wherein the lever is pivotally assembled to the fixing seat, and the load plate is pivotally assembled to the lever.

12. The electrical connector assembly as claimed in claim 11, wherein said load plate downwardly presses at least one of said electronic package and the holding section in a vertical direction perpendicular to said front-to-back direction.

13. The electrical connector assembly as claimed in claim 12, wherein said clip is unitarily made of plastic, and includes a mounting section mounted upon the printed circuit board and connected to the holding section via a linking section, said holding section being rotatable relative to the mounting section.

14. The electrical connector assembly as claimed in claim 13, wherein said mounting section includes a pair of clamping arms sidewardly sandwiching the housing in a transverse direction perpendicular to both the front-to-back direction and said vertical direction.

15. The electrical connector assembly as claimed in claim 14, wherein said pair of clamping arms abut against the housing in the front-to-back direction.

16. The electrical connector assembly as claimed in claim 13, wherein a cutout is formed between the linking section and the holding section to provide deflection of the clip.

17. The electrical connector assembly as claimed in claim 10, further including a securing device not only to fasten the clip in position but also lock the load plate in position when the lever is moved to a horizontal position.

18. The electrical connector assembly as claimed in claim 10, wherein said housing includes a plurality of positioning blocks for holding the electronic package, and said holding section includes a plurality of holding blocks for holding the electronic package.

19. The electrical connector assembly as claimed in claim 18, wherein aid positioning blocks and said holding blocks are offset from each other for not interfering with each other.

* * * * *